United States Patent
Redington et al.

(10) Patent No.: US 11,536,551 B1
(45) Date of Patent: Dec. 27, 2022

(54) EMBEDDED RADIAL FIRED LASER IGNITER

(71) Applicant: U.S. Government as Represented by the Secretary of the Army, Dover, NJ (US)

(72) Inventors: Stephen Redington, Wharton, NJ (US); John Hirlinger, Hackettstown, NJ (US); Gregory Burke, Haverhill, NH (US)

(73) Assignee: United States of America as Represented by the Secretary of the Army, Washington, DC (US)

( * ) Notice: Subject to any disclaimer, the term of this patent is extended or adjusted under 35 U.S.C. 154(b) by 0 days.

(21) Appl. No.: 17/458,789

(22) Filed: Aug. 27, 2021

Related U.S. Application Data

(60) Provisional application No. 63/071,099, filed on Aug. 27, 2020.

(51) Int. Cl.
*F42C 19/12* (2006.01)
*H01S 5/0233* (2021.01)

(52) U.S. Cl.
CPC ............ *F42C 19/12* (2013.01); *H01S 5/0233* (2021.01)

(58) Field of Classification Search
CPC ....... F42C 19/0815; F42C 19/12; F42B 3/113
USPC ........................................................ 102/201
See application file for complete search history.

(56) References Cited

U.S. PATENT DOCUMENTS

| | | | | |
|---|---|---|---|---|
| 3,362,329 A | * | 1/1968 | Epstein | F42B 3/113 280/741 |
| 3,685,392 A | * | 8/1972 | Platt | F41A 19/58 42/76.01 |
| 5,147,084 A | | 9/1992 | Behun | |
| 5,154,341 A | | 10/1992 | Melton | |
| 5,212,339 A | * | 5/1993 | Piltch | F42B 3/113 102/202 |
| 5,272,828 A | * | 12/1993 | Petrick | F41A 19/63 42/84 |
| 5,489,750 A | | 2/1996 | Sakemi | |
| 5,859,474 A | | 1/1999 | Dordi | |
| 6,610,430 B1 | | 8/2003 | Thompson | |
| 6,730,028 B2 | * | 5/2004 | Eppstein | A61B 10/0045 604/20 |
| 7,478,594 B1 | * | 1/2009 | Chen | F42B 3/113 102/201 |
| 7,546,804 B1 | * | 6/2009 | Tartarilla, III | F42B 5/38 102/470 |
| 9,618,307 B1 | * | 4/2017 | Redington | F42B 5/08 |
| 2003/0047101 A1 | * | 3/2003 | Folsom | F42B 3/113 102/201 |

(Continued)

*Primary Examiner* — Bret Hayes
(74) *Attorney, Agent, or Firm* — John P. DiScala

(57) ABSTRACT

A laser ignition assembly comprises first and second mounting surfaces opposed to each other. A central cavity is formed through the surfaces and sized to receive energetic material therein. A vertical solder bridge is formed between the surfaces and an edge emitting laser diode disposed between the surfaces. The laser diode is oriented such that a light fluence therefrom is directed in a radial direction into the central cavity. The surfaces can be circuit boards, e.g., copper clad, rigid circuit boards, and have an annular shape. The central cavity can be further defined by an interboard gap between the surfaces. The ignition assembly can fit within a primer cup of a munition.

12 Claims, 9 Drawing Sheets

(56) References Cited

U.S. PATENT DOCUMENTS

2004/0123763 A1\* 7/2004 Englund ................ F42B 3/113
                                                                   102/201

\* cited by examiner

EMBEDDED RADIAL FIRED LASER IGNITER

CROSS-REFERENCE TO RELATED APPLICATIONS

This application claims the benefit under 35 USC § 119(e) of U.S. provisional patent application 63/071,099 filed on Aug. 27, 2020.

STATEMENT OF GOVERNMENT INTEREST

The inventions described herein may be manufactured, used and licensed by or for the United States Government.

FIELD OF THE INVENTION

This invention relates generally to the field of ignition of small, medium and large caliber munitions and specifically, to the use of an optical source (laser or other light emitting source) contained within the base of each cartridge case in place of the traditional chemical primer.

BACKGROUND OF THE INVENTION

To initiate energetic material used in ammunition, explosives and similar items that are energetic in nature, current systems often utilize a small element designed to generate enough heat to cause a small amount of primary explosive to ignite. The reaction then propagates to other elements of the device to perform its intended function. This element is often referred to as a "bridge wire" and may be comprised of a very fine wire or conductive slurry. Either implementation is based on the resistance of the resultant conductive path through the material to be ignited. Such resistance will generate heat when current is passed through that path. This heat initiates the energetic material in immediate proximity and triggers the resultant chain reaction.

Bridge wires have significant downsides. They pose reliability and manufacturing issues. Bridge wires cannot be tested without initiating the device. Fragile wires can break in some applications. Finally, carbon slurries have wide manufacturing tolerances.

Further, since these devices are used in energetic items, their presence is associated with significant safety hazards to any personnel in the vicinity. Such devices tend to be susceptible to Radio Frequency (RF) energy in surrounding environments as well as Electro Static Discharge (ESD) energy when handled by personnel. As a result a catastrophic loss of life and/or property has been realized with such devices.

An alternate technology that is not susceptible to such environmental concerns is highly desirable. Laser based ignition technology, as disclosed in commonly owned U.S. Pat. No. 9,618,307 which is hereby incorporated by reference, is an example of one such alternative approach which is not susceptible to those environmental concerns. This approach also removes the energetic material from the primer cavity making the resultant assembly inert and safe to handle. In addition, the finished primer in such an ignition system is an electronic assembly suitable for manufacture and assembly by the established electronics assembly industry.

However, there are downsides associated with the embodiments described in U.S. Pat. No. 9,618,307. Because the embodiments described in this patent may require specialized construction techniques, additional manual labor or investments in specialized equipment would be needed to realize large production quantities at an acceptable unit production cost. Applications of the prior art tend to require high production quantities with a low unit cost. For this reason, methods that adapt existing infrastructure associated with the electronics surface mount industry would be preferable over methods that require an investment in specialized capital equipment and new infrastructure.

In addition, the invention of U.S. Pat. No. 9,618,307 requires the separation of the ignition material into a second stage. While this approach may be desirable in some instances, such as for large energetic devices, it is not desirable to ignition devices that are small and cannot tolerate an increase in space for the energetic train.

SUMMARY OF INVENTION

One aspect of the invention is a laser ignition assembly comprising a first mounting surface and a second mounting surface, a central cavity, a vertical solder bridge and an edge emitting laser diode. The first mounting surface and the second mounting surface are opposed to each other. The central cavity is formed by the first mounting surface and second mounting surface. The central cavity is sized and dimensioned to receive energetic material. The vertical solder bridge is formed between the first mounting surface and second mounting surface. The edge emitting laser diode is disposed between the first mounting surface and the second mounting surface and oriented such that a light fluence from said edge emitting laser diode is directed in a radial direction into the central cavity.

Another aspect of the invention is a laser ignition assembly comprising a first circuit board, a second circuit board, a central cavity, a vertical solder bridge and an edge emitting laser diode. The first circuit board has a bottom surface and the second circuit board has a top surface. The bottom surface and the top surface are opposed to each other. The first circuit board and the second circuit board are annular-shaped. The central cavity is defined by a hole in each of the first circuit board and the second circuit board. The central cavity is sized and dimensioned to receive energetic material. The vertical solder bridge is formed between the first circuit board and the second circuit board. The edge emitting laser diode is surface mounted to the bottom surface and the top surface and oriented such that a light fluence from said edge emitting laser diode is directed in a radial direction into the central cavity.

The invention will be better understood, and further objects, features and advantages of the invention will become more apparent from the following description, taken in conjunction with the accompanying drawings.

BRIEF DESCRIPTION OF THE DRAWINGS

In the drawings, which are not necessarily to scale, like or corresponding parts are denoted by like or corresponding reference numerals.

DETAILED DESCRIPTION

A laser igniter assembly comprises two standard copper clad rigid circuit boards forming a sandwich that makes contact with the top and bottom conductive surfaces of an edge emitting laser diode. In addition, and critically, a vertically formed solder bridges is created across an air gap between the two circuit boards. Such vertical solder bridges allow current paths to form between two isolated surfaces in air to create a vertical assembly.

Advantageously, commercially available automated surface mount equipment and techniques may be employed to assemble the laser igniter. This avoids the cost of developing specialized equipment for assembly. In addition, the laser igniter assembly described herein allows for the ignition material to be embedded into the primer cup and thus does not increase the space claim of the overall energetic ignition train.

The laser igniter assembly is described throughout as a laser igniter assembly for a munition primer. However, the laser igniter assembly is not limited to munition primers. The laser igniter assembly may be employed in any application in which an energetic material is ignited. For example, the laser igniter assembly may be employed to initiate explosives in the mining or petroleum industries, in air bag initiators or in demolition applications.

Vertical Solder Bridges

The laser igniter leverages the use of a vertical solder bridge to connect the two circuit boards and assemble the laser igniter assembly. The method of assembling chips through vertical soldering described herein involves the natural formation of a solder bridge between two opposing surfaces. The method is particularly applicable to thin electronic assemblies that require high circuit density in minimal space. Two standard copper clad surfaces are used to form a sandwich with an electrical connection between the two surfaces and with an air gap large enough to accommodate thin components placed between them, such as Chip Scale Packages (CSPs) and terminal devices. The method has been demonstrated to join two surfaces with a resultant air gap of as large as 0.01" allowing a maximum component height of 0.0098".

Figure 1:
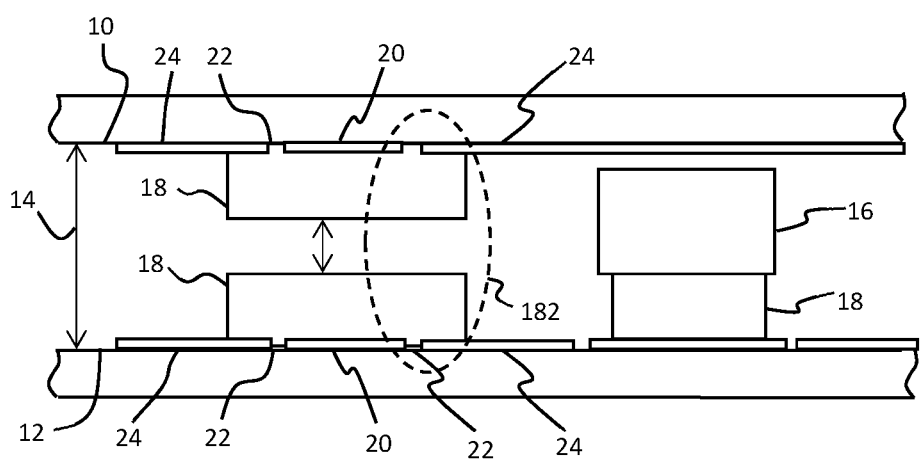
FIG. 1 is a cross-section of a PCB assembly prior to formation of a vertical solder joint via a vertical solder bridge method, according to an illustrative embodiment.
Figure 2:
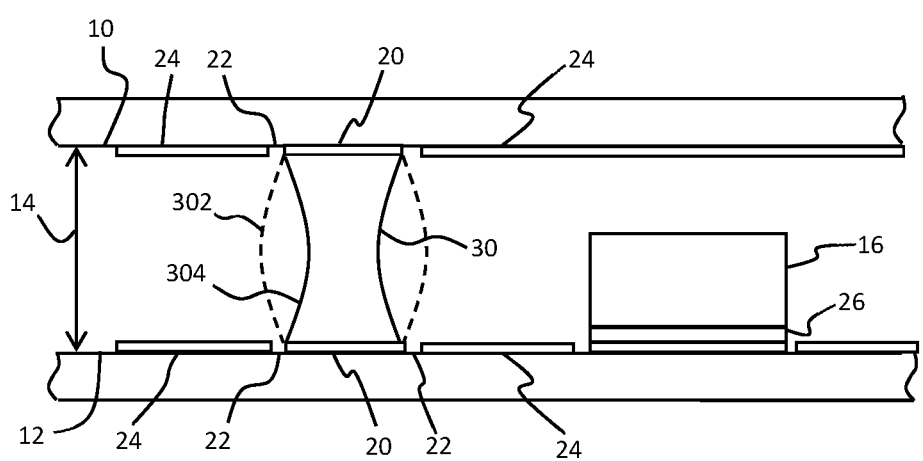
FIG. 2 is a cross-section of a PCB assembly with a vertical solder bridge, according to an illustrative embodiment.

FIG. 1 is a cross-section of a PCB assembly prior to formation of a vertical solder joint via a vertical solder bridge method, according to an illustrative embodiment. FIG. 2 is a cross-section of a PCB assembly prior to formation of a vertical solder joint via a vertical solder bridge method, according to an illustrative embodiment.

Each figure shows a cross section of the PCB assembly as seen from the edge. As shown in FIG. 1, two opposing surfaces 10, 12 of printed circuit board (PCB) material are prepared to be electrically joined via the formation of a vertical solder joint with a resultant gap 14 between the surfaces 10, 12. One or more components 16 is positioned between the two PCB surfaces 10, 12 for mounting on the bottom PCB surface 12 within the resultant gap 14.

For example, the components 16 may be chip scale packages (CSPs) and two terminal devices, such as a metric 0201 package based on Joint Electron Device Engineering Council (JEDEC) standards. The resultant inter-board gap 14 can be limited by the maximum height of the components 16 between them or a spacer material of the desired finished inter-board gap 14 height.

Figure 3:
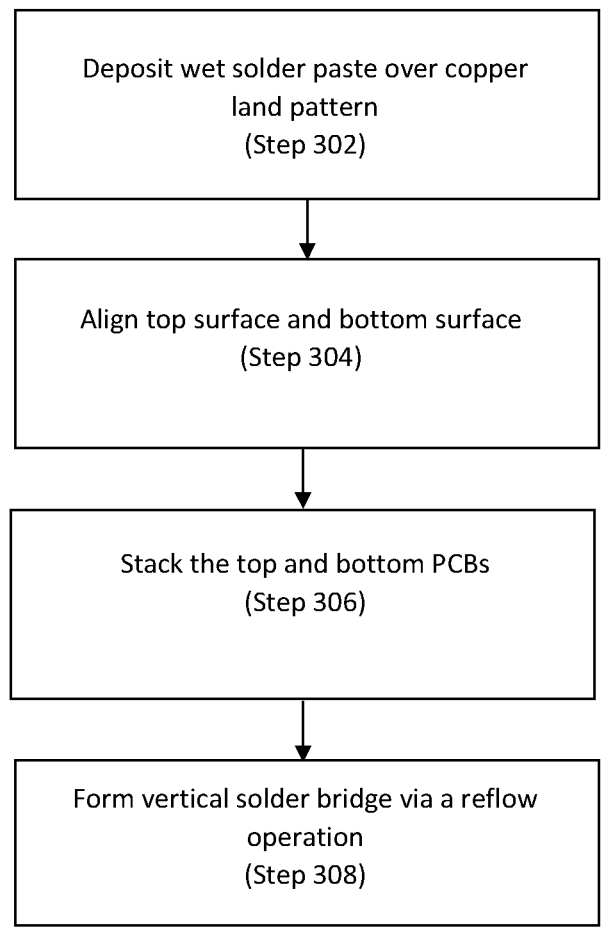
FIG. 3 is a flowchart illustrating a method of forming a vertical solder bridge, according to an illustrative embodiment.

FIG. 3 is a flowchart illustrating a method of forming a vertical solder bridge, according to an illustrative embodiment. In Step 302, on each PCB surface 10, 12, wet solder paste 18 is deposited over a copper land pattern 20 to be joined using conventional surface mount technology (SMT) techniques. In embodiments of the invention, the copper land patterns are surrounded by a gap region 22 and a layer of solder mask 24.

The deposit of wet solder paste 18 is such that there is an excess amount of paste that extends beyond the projection of the exposed copper land pattern. This excess is herein referred to as an overprint 182. This overprint 182 extends onto the bare PCB material of the gap region 22 and may extend onto the surrounding solder mask 24. The overprint 182 is contained within a boundary that is sufficiently clear of other solderable elements to prevent the formation of unintended solder joints. The solder mask 24 aids this operation.

The height of the wet solder paste 18 is controlled by the thickness of a stainless steel stencil used in the printing process. The overall volume of the deposited wet solder paste 18 is thereby determined by the stencil thickness and area of the aperture in the stencil. Alternatively the height and area of the wet paste may be controlled by a direct paste printing technology. As will be described in further detail below, the height and volume of the wet solder paste 18 are selected to ensure a reliable solder bridge 30 is formed between the two deposits of wet solder paste 18 during a reflow operation.

In step 304, the top surface 10 and bottom surface 12 are aligned with a spacer material in between (not shown) to reinforce the desired inter-board gap 14 that results after a solder reflow operation. In the absence of spacer material the resultant inter-board gap 14 may be determined by the maximum height of the SMT components 16 placed between the surfaces 10, 12. Such components 16 are soldered to a surface 10, 12 using traditional means. In this case, the component 16 acts as the spacer material with the physical contact with the top surface of the component 16 after reflow creating the inter-board gap 14. When this method is utilized care is taken to avoid electrical contact with the opposing surface to create unintended alterations of the circuit function. In some cases this electrical contact may be desired and can replace the vertical solder bridge 30 when the component 16 has a contact with little or no resistance from top to bottom.

In step 306, the two PCBs are then stacked such that the two wet solder paste deposits 18 are aligned. This stack will result in an inter-board gap 14 that may be determined by a spacer material (not shown) or limited by physical contact with a SMT component 16.

The paste overprint 182 must allow for the alignment tolerance of the top and bottom elements and provide added volume to form a solder bridge 30 after solder reflow in an oven. This alignment must be precise. The method for alignment may be facilitated by the use of tooling pins and is a standard practice for operations requiring precise alignment.

The resultant inter-board gap 14 illustrated in FIG. 1 and FIG. 2 is large enough to contain thin SMT components 16 that are intended to be soldered as part of the assembly.

FIG. 1 also shows a residual air gap 14 between the top and bottom wet solder paste deposits 18 after alignment but prior to reflow. When the upper and lower wet solder paste deposits 18 are sufficiently large in volume, the two surfaces will merge together during a reflow operation and form a solid connection.

Figure 4:
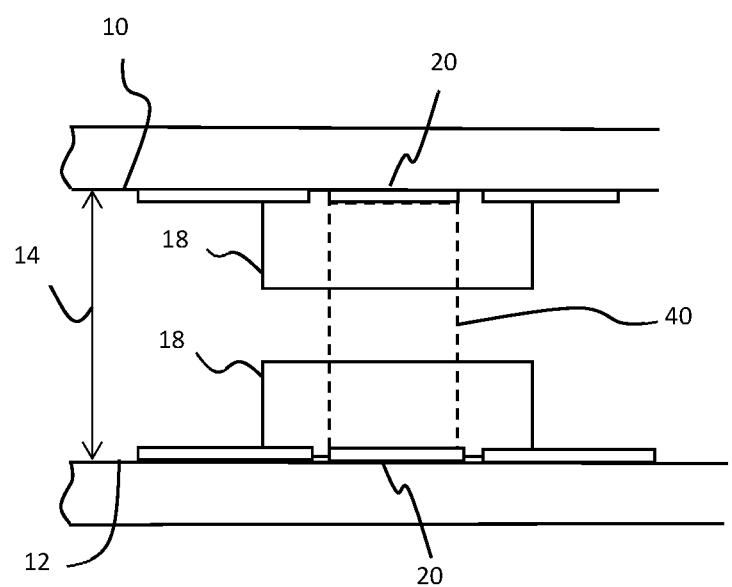
FIG. 4 shows is a close up view of the wet solder paste of FIG. 1, according to an illustrative embodiment.

In step 306, solder joint is formed between the top surface 10 and the bottom surface 12 by merging the wet solder paste 18 on the top surface 10 with the wet solder paste 18 on the bottom surface 12 via a reflow operation FIG. 4 shows is a close up view of the wet solder paste of FIG. 1, according to an illustrative embodiment. It has been demonstrated that if the resultant volume of reflowed solder paste can fill the volume of a cylinder 40 between the top and bottom copper land patterns 20, a reliable solder joint will form. This joint will resemble that of a typical Ball Grid Array (BGA) component. Such joints have well established reliability characteristics and are widely used in electronic assemblies.

The volume of wet solder paste 18 is determined to ensure a reliable vertical solder bridge 30 forms. Starting from a known volume of a cylinder 40 between copper land patterns, the volume of wet solder paste 18 may be determined. The volume may be discovered experimentally or derived mathematically. A general approximation of 50% could be used in most applications with acceptable results.

For example, wet solder paste is comprised of microscopic spheres of solder embedded in a liquid flux. Accordingly, the resultant solid volume after reflow is roughly the volumetric ratio of a cube to a sphere of the same dimension. This ratio is 1.000 to 0.524 or a 52.4% reduction in volume. A more accurate calculation compensates for the inability to tightly pack multiple spheres together due to flux and air with a loss factor. Based on an assumption of 90% packing efficiency this reduction in volume is roughly 47%. That is to say; a cube of solder paste will reduce to approximately 47% of its original volume after reflow.

Alternatively, a more precise approximation can be found experimentally for any solder paste in question. The inventor has found that for Type 4 (20-38 um particle size) solder paste of IPC standard J-STD-005, the 47% factor was proven to be accurate when compared to a factor experimentally derived by reflowing a known volume of paste. Accordingly, a general approximation of 50% could be used in most applications with acceptable results.

In embodiments, the copper land patterns of both top surface 10 and bottom surface 12 are circular. This not only simplifies analysis but the circular shape maintains symmetry of molten solder. This results in a cylindrical shape when sufficient excess paste is deposited. In addition, in these embodiments, the following conditions were found to produce a reliable vertical solder joint:

1) The diameter of the copper land pattern is greater than 2 times the inter-board gap 14 between the top surface 10 and bottom surface 12.

2) The diameter of the wet solder paste 18 deposited on the copper land is larger than the diameter of the copper land pattern such that the height of the reflowed solder paste is taller than the deposited wet solder paste 18 height.

3) The total volume of wet solder paste 18 deposited between top surface 10 and bottom surface 12 is roughly twice the volume of a solid cylinder that is formed by the diameter of the copper lands and the distance between them.

It should be noted that the third condition above is not required to be followed exactly. Paste volumes slightly less than a solid cylinder may form a cylinder that is necked down in the middle if there is sufficient material to connect. Paste volumes slightly in excess of a full cylinder will tend to bulge in the middle. This condition is preferable as the finished joint will resemble that of a standard ball grid array.

FIG. 2 below shows resultant solid solder configurations that will result after a reflow operation. The dashed lines indicate the desired shape 304 of the vertical solder bridge 30 while the solid lines indicate the minimally acceptable configuration 302.

FIGS. 1 and 2 also show a standard surface mount component prior to reflow and after reflow next to the completed vertical solder bridge. FIG. 2 shows the component 16 mounted to the bottom surface 12 by the solder joint subsequent the reflow operation. All intended components 16 that make up the final assembly must be thinner than any spacer material that determines the resultant inter-board gap 14 between the top surface 10 and bottom surface 12 to be joined. As previously stated, the method is more successful when the illustrated gap 14 is kept relatively small, for example less than 0.02".

It is also important to keep the resultant inter-board gap width uniform across the two surfaces 10, 12 to be joined. This can be done by fabricating a material with a controlled thickness of the desired final gap width. Such material is commonly available in prefabricated thicknesses to support the fabrication of multilayer PCBs. This material can be applied to the outer perimeter of the two assemblies or to void areas in between. In an embodiment, this material may be made to conform to the same alignment mechanism used to join the two assemblies. An alternate spacing mechanism could be comprised of nothing more than a uniform distribution SMT components 16 placed in such a way as to avoid interference with the circuit of the opposing layer.

In one embodiment, the resultant inter-board gap 14 is comprised of air. In some situation a more robust final assembly is desired for harsh environments. In this case the relatively small gap between the two surfaces 10, 12 will facilitate the application of a liquid fill material via natural capillary action. This material can easily be applied from the edge of the assembly or small holes on one surface. The incorporation of more than one hole will allow for the visual verification that the fill material has penetrated the gap sufficiently. Such fill material will also reinforce the vertical solder bridge structural integrity throughout the lifecycle of the assembly.

Figure 5:
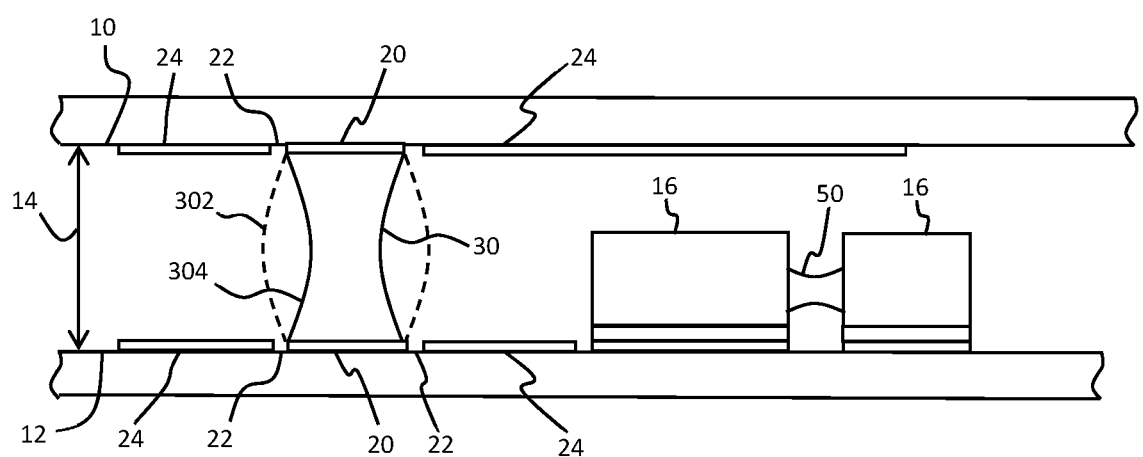
FIG. 5 is a cross-section of a PCB assembly with a horizontal solder bridge, according to an illustrative embodiment.

FIG. 5 is a cross-section of a PCB assembly with a horizontal solder bridge, according to an illustrative embodiment. In addition to the formation of vertical solder bridges, it may be desirable to connect adjacent circuit elements in a horizontal plane rather than a vertical surface. Such horizontal bridges 50 would be used to create optional circuit pathways at the time of assembly. The reliability of horizontal solder bridges 50 may make them impractical and unreliable when the gap to be bridged is large. However, in circuit assemblies where small space and volume are a priority, the method described herein offers a practical benefit when the resultant bridging gap is sufficiently small. In the case of this invention a horizontal air gap of 0.004" in a circular land pattern is reliably bridged when following the same criteria for the vertical case but for only one side of the assembly.

Laser Igniter Assembly

Figure 6:
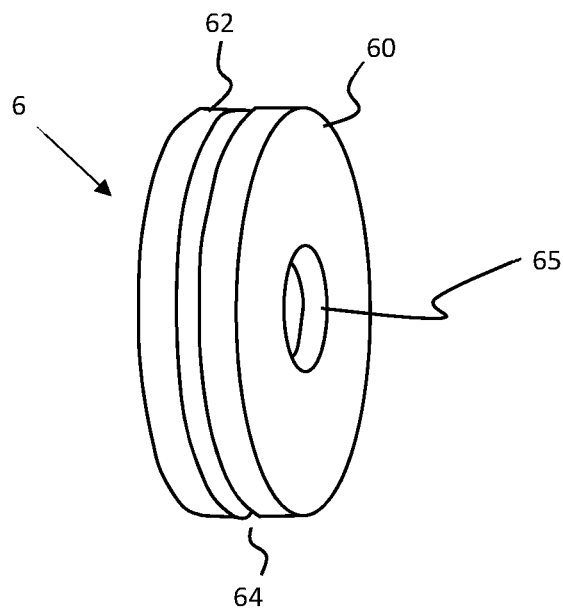
FIG. 6 is a perspective view of a center fire laser assembly, according to one illustrative embodiment.
Figure 7:
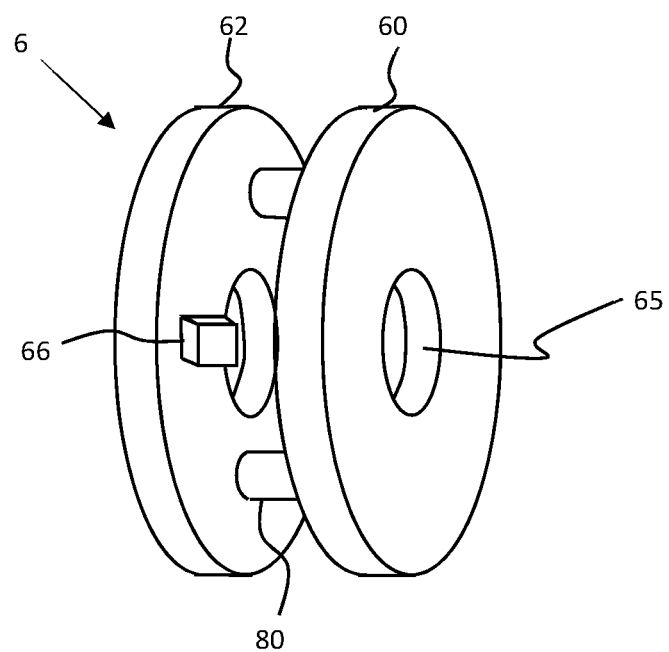
FIG. 7 is an exploded view of a center fire laser assembly, according to one illustrative embodiment.

The method of assembling a chip assembly using a vertical solder bridge is implemented in the assembly of a laser igniter 6. The vertical solder bridge is utilized in the laser igniter assembly 6 described herein to electrically connect two mounting surfaces 60, 62. FIG. 6 is a perspective view of a center fire laser assembly, according to one illustrative embodiment. FIG. 7 is an exploded view of a center fire laser assembly, according to one illustrative embodiment.

The laser assembly comprises a first mounting surface 60, a second mounting surface 62, an inter-board gap 64, a central cavity 65, a vertical solder bridge 80 and an edge emitting laser 66. In embodiments of the invention, the laser igniter assembly 6 may comprise other surface mount components of similar thickness.

This first mounting surface 60 and the second mounting surface 62 provide the body of the laser igniter assembly 6 and a structure upon which to mount the edge emitting laser. The first mounting surface 60 and the second mounting surface 62 are opposed to each other and connected via the vertical solder bridge. The edge emitting laser diode 66 is surface mounted between the first mounting surface 60 and the second mounting surface 62.

In embodiments of the invention, the first mounting surface 60 and second mounting surface 62 are surface of a circuit board. For example, each disk may be fabricated from standard copper clad Printed Circuit Board (PCB) material used in the electronics industry. For the embodiment presented herein, the two circuit boards are annular disks. These disks are sized and dimensioned to fit into the cup or volume utilized by the finished primer assembly. In center fire applications, a center hole in each disk will form the central cavity 65 needed to hold energetic material.

An interboard gap 64 is restricted by the maximum height of the components mounted between the two disks.

The laser igniter assembly 6, as shown in FIG. 1, requires electrical current paths to form between the top mounting surface 60 and the bottom mounting surface 62 to ultimately contact the edge emitting laser diode 66 placed in the resultant inter board gap 64.

The edge emitting laser diode 66 is placed in the interboard gap 64 between the first mounting surface 60 and the second mounting surface 62. The edge emitting laser diode 66 is surface mounted to at least one of the surfaces and in the embodiments described herein, to both surfaces. The edge emitting laser diode 66 is positioned such that the light effluence is emitting radially toward the central cavity 65 of the laser assembly. In other embodiments which are not center-fired, the edge emitting laser diode 66 may be positioned such that it outputs light effluence toward the outer diameter of the discs.

Other surface mount components of similar thickness may also be included as part of the assembly provided certain height restrictions are met. Standard components that are equal in height or are up to 0.002" thicker than the laser diode 66 being mounted have proven to be acceptable. As the thickness of such ancillary components increases beyond the thickness of the laser, the gap between deposited paste layers and the laser surfaces increase to the point where a reliable solder joint involving the laser surfaces no longer forms.

Figure 8:
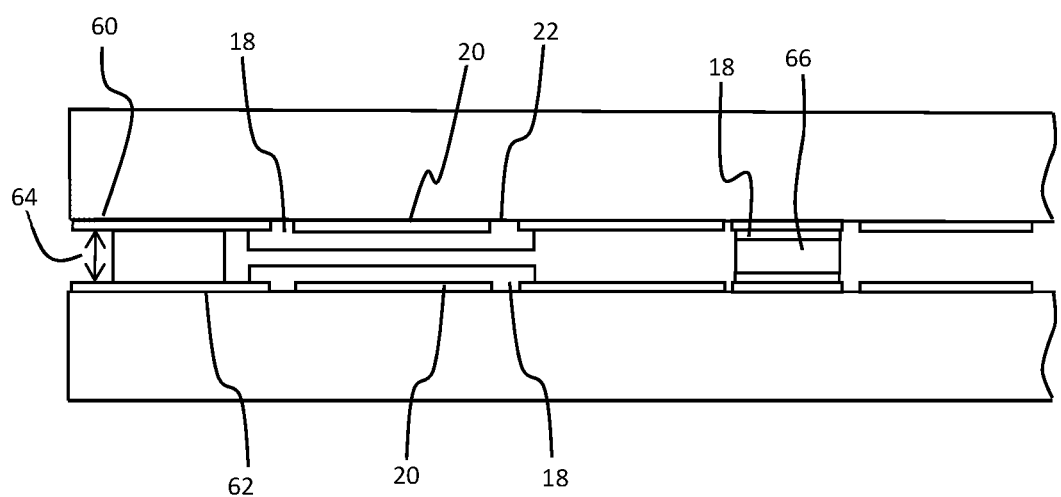
FIG. 8 is a side view of a laser diode chip prior to reflow, according to one illustrative embodiment.
Figure 9:
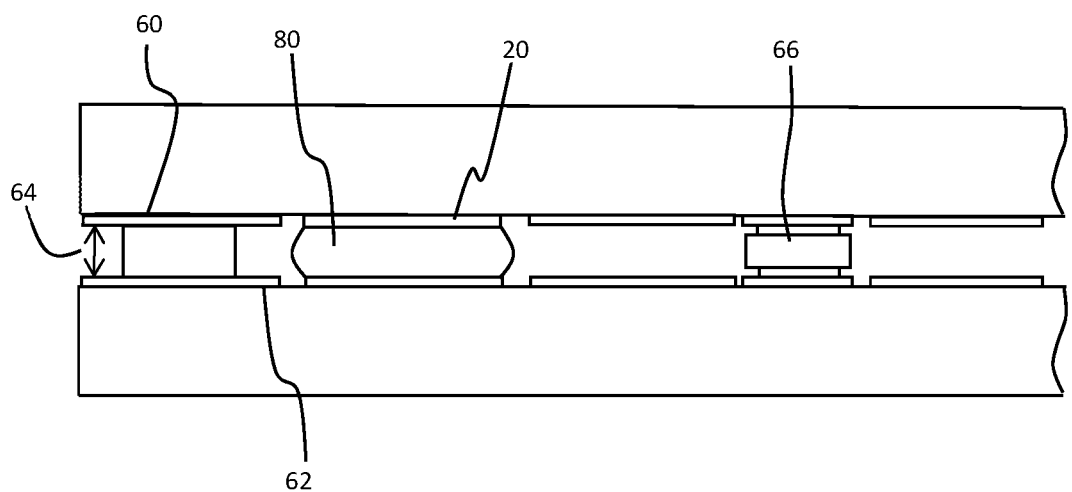
FIG. 9 is a side view of a laser diode chip after reflow, according to one illustrative embodiment.

FIG. 8 is a side view of a laser diode chip prior to reflow, according to one illustrative embodiment. FIG. 9 is a side view of a laser diode chip after reflow, according to one illustrative embodiment. Each figure shows a cross section of the PCB assembly as seen from the edge. As shown in FIG. 8, the top surface 60 and the bottom surface 62 of printed circuit board (PCB) material are prepared to be electrically joined via the formation of a vertical solder joint with a resultant gap 64 between the surfaces. The edge laser diode 66 is positioned between the two PCB surfaces for mounting on the bottom PCB surface within the resultant gap 64.

While the invention has been described with reference to certain embodiments, numerous changes, alterations and modifications to the described embodiments are possible without departing from the spirit and scope of the invention as defined in the appended claims, and equivalents thereof.

What is claimed is:

1. A laser ignition assembly comprising:
   a first mounting surface and a second mounting surface, said first and second mounting surface opposed to each other;
   a central cavity formed in the first mounting surface and second mounting surface, said central cavity sized and dimensioned to receive energetic material;
   a vertical solder bridge formed between the first mounting surface and second mounting surface; and
   an edge emitting laser diode disposed between the first mounting surface and the second mounting surface and oriented such that a light fluence from said edge emitting laser diode is directed in a radial direction into the central cavity.

2. The laser ignition assembly of claim 1 wherein the first mounting surface and second mounting surface are circuit boards.

3. The laser ignition assembly of claim 2 wherein the first mounting surface and second mounting surface are copper clad rigid circuit boards.

4. The laser ignition assembly of claim 1 wherein the first mounting surface and second mounting surface are annular shaped.

5. The laser ignition assembly of claim 4 wherein the central cavity is further defined by an interboard gap between said first mounting surface and second mounting surface.

6. The laser ignition assembly of claim 4 wherein the first mounting surface and second mounting surface are sized and dimensioned to fit within a primer volume of a munition.

7. The laser ignition assembly of claim 6 wherein the primer volume is a primer cup.

8. The laser ignition assembly of claim 1 wherein the edge emitting laser diode is a surface mount laser diode chip.

9. A laser ignition assembly comprising:
   a first circuit board having a bottom surface and a second circuit board having a top surface, said top surface and bottom surface being opposed to each other and wherein the first circuit board and the second circuit board are annular-shaped;
   a central cavity defined by a hole in each of the first circuit board and the second circuit board, said central cavity sized and dimensioned to receive energetic material;
   a vertical solder bridge formed between the first circuit board and second circuit board; and
   an edge emitting laser diode surface mounted to the bottom surface and the top surface and oriented such that a light fluence from said edge emitting laser diode is directed in a radial direction into the central cavity.

10. The laser ignition assembly of claim 9 wherein the first circuit board and second circuit board are copper clad rigid circuit boards.

11. The laser ignition assembly of claim 9 wherein the first circuit board and the second circuit board are sized and dimensioned to fit within a primer volume of a munition.

12. The laser ignition assembly of claim 11 wherein the primer volume is a primer cup.

\* \* \* \* \*